United States Patent [19]
Salem

[11] 4,030,086
[45] June 14, 1977

[54] BATTERY VOLTAGE DETECTION AND WARNING MEANS

[75] Inventor: Robert J. Salem, Danbury, Conn.
[73] Assignee: General Electric Company, Bridgeport, Conn.
[22] Filed: Nov. 10, 1975
[21] Appl. No.: 630,201
[52] U.S. Cl. .................. 340/249; 340/237 S
[51] Int. Cl.² .................. G08B 19/00; G08B 17/10
[58] Field of Search ........... 340/237 S, 249, 248 B, 340/253 C, 376; 324/295

[56] References Cited
UNITED STATES PATENTS

| | | | |
|---|---|---|---|
| 568,608 | 9/1896 | Gibbs | 340/376 |
| 2,324,618 | 7/1943 | Dietrich | 340/376 X |
| 3,158,713 | 11/1964 | Margulies | 340/376 X |
| 3,548,205 | 12/1970 | Ogden | 340/237 S |
| 3,811,123 | 5/1974 | Hamm et al. | 340/249 |

Primary Examiner—John W. Caldwell
Assistant Examiner—Daniel Myer
Attorney, Agent, or Firm—George R. Powers; Leonard J. Platt; John F. Cullen

[57] ABSTRACT

A battery operated smoke detector or the like is provided with means for monitoring the voltage of the battery and providing a warning when the voltage drops below a predetermined level. The detection and warning system includes means for sensing when the battery voltage has dropped below the predetermined level and producing periodic output signals in response thereto. A first alarm means produces a permanent warning signal in response to the first output signal, and a second alarm means produces periodic warning signals in response to the periodic output signals.

5 Claims, 2 Drawing Figures

BATTERY VOLTAGE DETECTION AND WARNING MEANS

BACKGROUND OF THE INVENTION

1. Field of the Invention

This invention relates to battery voltage monitoring apparatus for smoke detectors and the like and, more particularly, to battery voltage monitoring means for producing both a permanent warning signal and periodic warning signals in response to the detection of a low battery voltage for a period of time.

2. Description of the Prior Art

In modern smoke detectors of the ionization type, low voltage batteries are often used as the power source for the smoke detection apparatus and the associated alarm apparatus for sounding a warning horn or otherwise communicating a warning signal when the smoke level exceeds a predetermined level. While these detectors are typically designed to draw extremely small currents during normal operation, the batteries are eventually depleted of a significant portion of their stored energy. If permitted to remain as the power source, such a battery would be incapable of providing for an extended period the energy required to produce the warning signals in the event of a fire. Eventually, the battery would go completely dead and even be incapable of supporting the sensing function of the smoke detector. It is therefore imperative that the battery be replaced while it still has sufficient stored energy to support the required sensing and warning function of the smoke detector. With this in mind, efforts have been made in the past to detect when the battery is depleted of a certain amount of its energy and produce in response thereto appropriate warning signals. These efforts have been enhanced by the appearance on the market of batteries in which the output voltage permanently drops a significant and detectable amount after the depletion of a predetermined amount of the initial battery energy. For example, Mallory Battery Model No. 304116 has an initial no load voltage of approximately 12.3 volts, which drops somewhat abruptly and permanently to approximately 10.6 volts after 60 percent of its energy has been expended.

A typical warning approach is to provide means for sensing when the battery energy has declined to a predetermined level and producing in response thereto periodic warning signals, such as the sounding of a warning horn of the smoke detector once a minute or at other frequent periods for an extended period of 7 or more days. If the battery voltage detection and warning system is to be powered by the same battery used for the smoke detection and warning system, it must also place a low current drain on the battery in order for the already depleted battery to support the periodic warning signals for an extended period without depleting the battery energy to such an extent that it is incapable of supporting the smoke detection and warning functions of the smoke detector. In spite of the extended period during which a low battery warning signal is produced in such systems, these approaches are not entirely effective in warning the homeowner or other user of the low battery energy condition since the warning signals cease when the battery is fully depleted. If the homeowner is absent throughout the warning period, he will not be warned upon his return that the battery is fully depleted and that the smoke detector is therefore inoperative.

SUMMARY OF THE INVENTION

It is a primary object of this invention to provide improved means for early warning of the pending depletion of a battery in battery-operated equipment such as smoke detectors.

Another object of this invention is to provide in battery-operated smoke detectors or the like improved means for periodically and permanently warning of a low battery energy condition.

Yet another object is to provide improved means for providing the foregoing objects for an extended period without placing an undue load on the battery.

Still another object is to provide highly reliable means for sensing a low battery energy condition and providing periodic and permanent warnings in response thereto.

A still further object is to provide highly sensitive and reliable means for warning of a low battery energy condition without being responsive to brief transients in the battery or system characteristics.

Briefly stated, in carrying out the invention in one form, means are provided for detecting when the battery voltage drops below a predetermined level for a period of time and providing a warning in response thereto. The detection and warning means includes terminal means for connection to a battery and circuit means connected to the terminal means, the circuit means being selected such that a selected electrical characteristic therein varies in a known manner with respect to variations in the voltage of a battery connected to the terminal means. Signal generating means is coupled to the circuit means for sensing the selected electrical characteristic and for periodically producing an output signal when the selected electrical characteristic for a period of time is consistent with a battery voltage of less than a predetermined level. A first alarm means is coupled to the signal generating means for receiving at least the first output signal therefrom and producing a permanent warning signal in response thereto. A second alarm means is also coupled to the signal generating means for receiving output signals therefrom and periodically producing transient warning signals in response thereto.

By a further aspect of the invention, the first alarm means includes a display element movable between a first non-warning position and a second warning position and actuating means for moving the display element to the second warning position in response to an output signal from the signal generating means. The first alarm means further includes switching means coupled to the display element and the actuating means, which is electrically powered, for controlling energization of the actuating means. The switching means is controlled by the position of the display element so as to be conductive only when the display element is in its first non-warning position. In this manner, the actuating means can be energized only upon the generation of an output signal while the display element is in the first non-warning position. By a still further aspect of the invention, the signal generating means includes a first circuit means including a capacitor, second circuit means connected to the first circuit means and the terminal means for gradually charging the capacitor when the voltage of a battery connected to the terminal means drops below a predetermined level for a period of time, and third circuit means connected to the first circuit means for rapidly discharging the capacitor when the charge on the capacitor exceeds a predetermined level.

BRIEF DESCRIPTION OF THE DRAWINGS

While the novel features of this invention are set forth with particularity in the appended claims, the invention, both as to organization and content, will be better understood and appreciated, along with other objects and features thereof, from the following detailed description taken in conjunction with the drawings in which:

DETAILED DESCRIPTION

Figure 1:
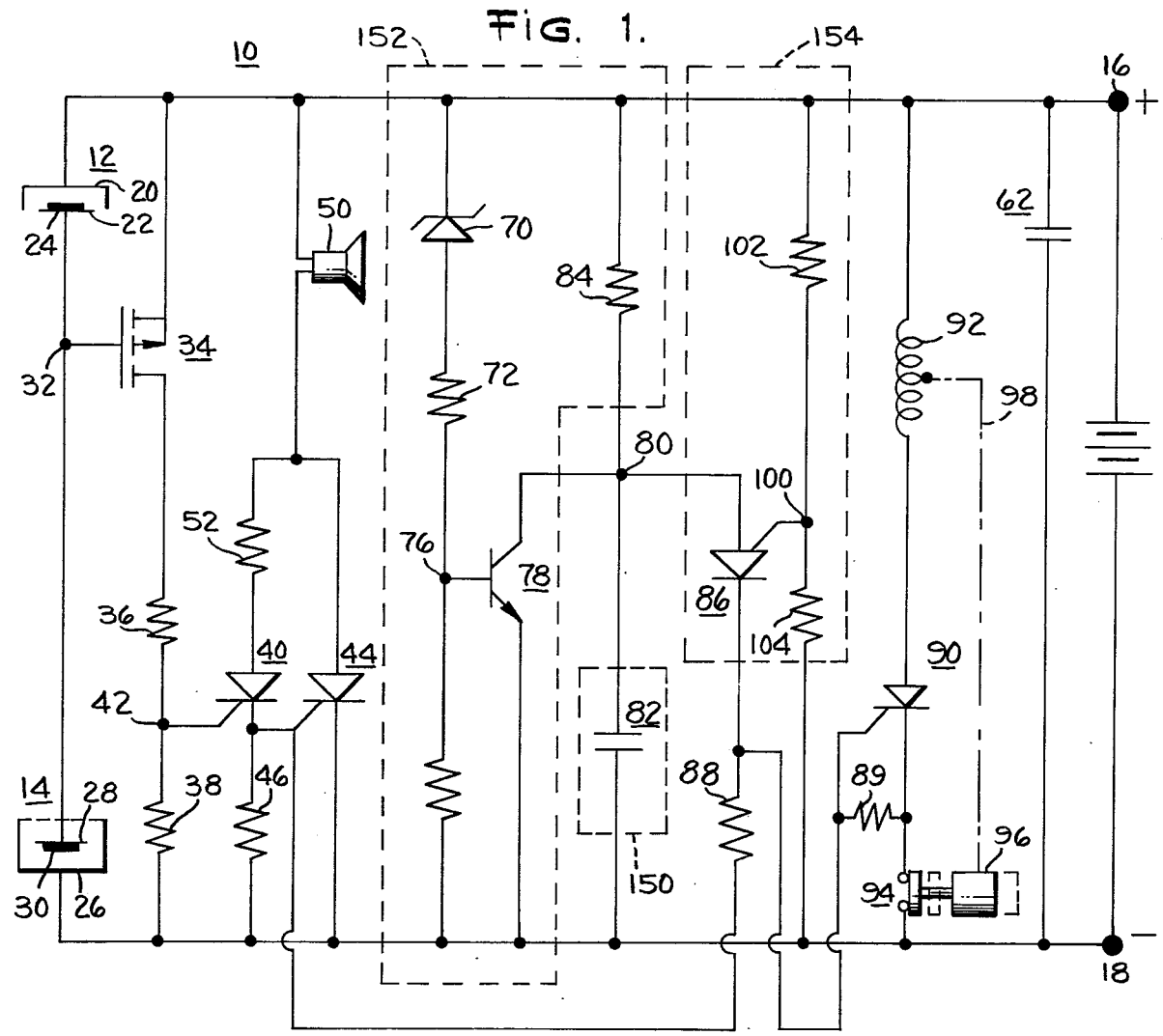
FIG. 1 is a circuit diagram of a battery smoke detector incorporating the low battery energy detection and warning means of this invention.

Referring first to FIG. 1, a smoke detector 10 incorporating the present invention is illustrated, the smoke detector 10 including a pair of ionization chambers 12 and 14 connected in series across a pair of terminals 16 and 18 to which a suitable source of direct current power may be connected. The particular circuit illustrated is designed to be connected to a direct current battery having a voltage of 12.3 volts, the positive and negative terminals of the battery being connected to the terminals 16 and 18, respectively, as indicated. The chamber 12 is open to the atmosphere and its interior is thus freely accessible to air and airborne products of combustion or aerosols. The chamber 14 is substantially closed and its interior is thus not freely accessible to airborne products of combustion, but is sufficiently open to admit air and adjust over a period of time to atmospheric variations in humidity, pressure and the like. For reasons which will become apparent as this description proceeds, the chamber 12 is a measuring chamber and the chamber 14 is a reference chamber.

As illustrated, the measuring chamber 12 includes a pair of spaced-apart electrodes 20 and 22 and a source 24 of alpha radiation such as Americium 241 for ionizing the air in the interior space between the electrodes 20 and 22. An ion current will flow between the electrodes 20 and 22 when a voltage is applied thereacross. If aerosols or products of combustion enter the interior space of the chamber 12, the current flow will be reduced if the voltage across the electrodes is maintained constant. In other words, the introduction of combustion aerosols increases the electrical resistance of the chamber 12, the amount of resistance change being indicative of the amount of combustion products present in the chamber 12. The measuring chamber 12 is designed to operate in a linear mode in which there is substantially direct relationship between applied voltage across the chamber and ion current. The reference chamber 14 includes a pair of spaced-apart electrodes 26 and 28 and a source 30 of alpha radiation such as Americium 241 for ionizing air molecules in the interior space between the electrodes 26 and 28. Since products of combustion are effectively barred from entering the interior of chamber 14, and since the chamber is operated at such high electric field strengths to cause current saturation, there is substantially only one possible ion current level regardless of voltage (under ambient conditions).

Figure 2:
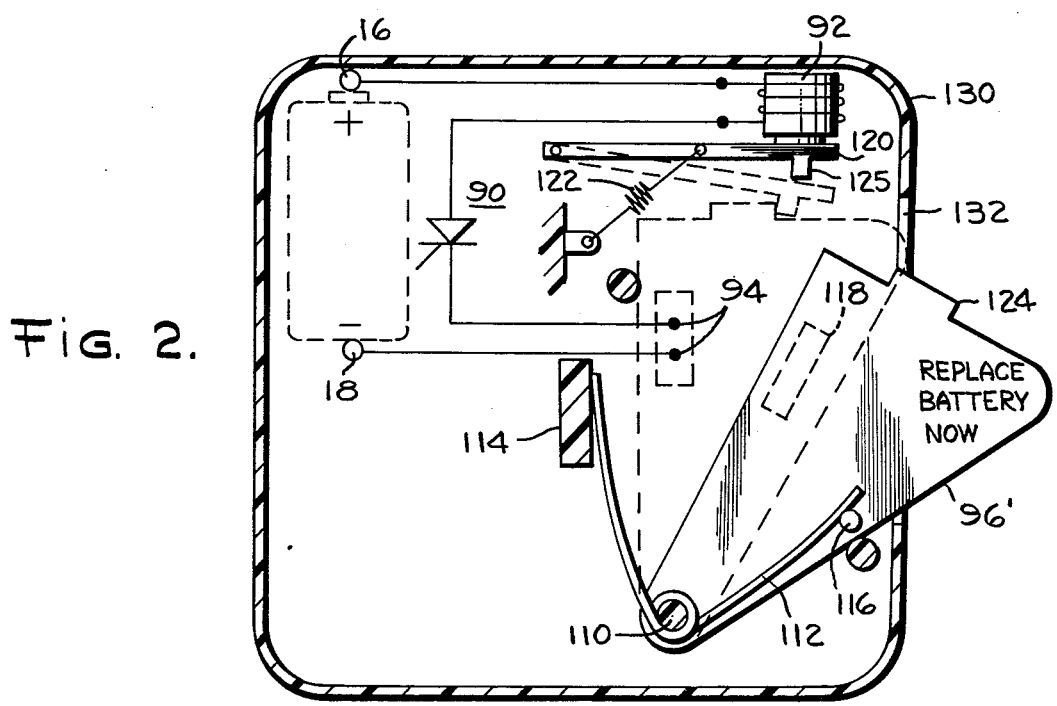
FIG. 2 is a generally schematic view disclosure of a movable display element and actuating means therefor suitable for use in the detection and warning system of FIG. 1.

Still referring to FIGS. 1 and 2, the chambers 12 and 14 are connected in series across the terminals 16 and 18 such that the substantially fixed voltage $V_B$ of a battery connected to the terminals is applied across the circuit comprising the two chambers. Since the reference chamber 14 is intentionally designed to operate in a saturated mode, it is clear that a substantially constant ion current will flow through the chamber 14 at all times. Since the chambers 12 and 14 are connected in series, the same ion current will flow at all times through the measuring chamber 12. In the absence of smoke, the voltage drop across the chamber 12 will be maintained at a level consistent with the ion current. If, however, aerosols or products of combustion enter the chamber 12, the resistance of the chamber 12 will increase, thus causing an increase in the voltage drop across the chamber 12 in order to maintain the saturated current flow called for by the saturated reference chamber 14. Under these circumstances, the voltage drop across the reference chamber 14 will decrease in order to maintain the total voltage drop equal to the battery voltage applied to terminals 16 and 18. It will thus be seen that the voltage at the junction 32 intermediate the chambers 12 and 14 is indicative of the level of airborne products of combustion within the chamber 12. This voltage is sensed and an alarm is sounded when the voltage is consistent with the presence of a predetermined minimum amount of smoke or the like within the chamber 12.

The smoke detection apparatus includes a MOSFET field effect transistor 34 of the enhancement type having its gate coupled to the junction 32 intermediate the chambers 12 and 14. The source of the MOSFET 34 is connected to the positive terminal 16, and the drain of the MOSFET is connected through series resistors 36 and 38 to the negative terminal 18. High gain switching means comprising a pair of cascaded SCR's are coupled to the MOSFET 34 by having the gate of the first SCR 40 connected to the junction 42 between the two series resistors 36 and 38. The cathode of the first SCR 40 is connected both to the gate of the second SCR 44 and through a resistor 46 to the negative terminal 18. The second SCR is connected in series with a horn assembly 50 across the terminals 16 and 18. A resistor 52 is provided between the anode of the first SCR 40 and the horn assembly 50. A capacitor 62 is provided across the terminals 16 and 18 to prevent rapid changes in supply voltage during sounding of the horn 50.

When there is no smoke or other airborne products of combustion within the measuring chamber 12, the voltage across the measuring chamber 12 is less than the threshold voltage of the MOSFET 34. Since the MOSFET 34 is of the enhancement type, this means that the MOSFET is essentially OFF (not conducting) under these conditions. Since the MOSFET 34 is essentially OFF, there is substantially no current flow through the resistors 36 and 38 and the junction 42 is maintained at a voltage substantially identical to that of the negative terminal 18. As a result, the first SCR 40 is also maintained in its OFF Or non-conductive condition. Since the first SCR 40 is not conducting, the gate of the second SCR 44 is also maintained at the voltage of the negative terminal 18. This means that the SCR 44 remains non-conductive and the horn 50 is not sounded. It should be noted that all elements of the sensing and switching means are turned OFF under these conditions and thus will place no continuous current drain on a battery connected across the terminals 16 and 18.

If smoke or other combustion products enter the chamber 12, the voltage across the chamber 12 and the source-to-gate of the MOSFET 34 will increase and thereby progressively turn on the MOSFET 34. The circuit elements may be selected and adjusted such that a preselected conduction level through the MOSFET 34 is reached when 2 percent smoke is present in the measuring chamber 12, the preselected conduction level being reached when the voltage at junction 32 is consistent with the presence of at least 2 percent smoke in the chamber 12. In other words, the MOSFET 34 will conduct at the preselected level whenever the smoke concentration within the chamber is at or above the preselected trigger point (2 percent). Through proper selection and adjustment of the components, the MOSFET 34 can be made to reach the preselected level of conduction at any desired minimum amount of smoke concentration. Once the MOSFET 34 reaches the preselected conduction level, current flow through the resistors 36 and 38 causes the voltage at junction 42 to increase sufficiently to turn on the first SCR 40. Due to the current flow through the SCR 40 and the resistor 46, the voltage on the gate of the SCR 44 will be sufficient to turn on the SCR 44 and thus sound the horn 50. If the smoke level in chamber 12 drops below the preselected trigger point, the voltage at the junction 32 will rise, and the source-to-gate voltage on the MOSFET 34 will therefore fall below the level required to maintain the preselected level of conduction through the MOSFET 34 and the resistors 36 and 38. This means that the voltage at junction 42 will also fall and the SCR 40 will turn OFF when its current falls below its holding level (due to periodic opening during horn operation of the normally closed horn contacts). This in turn will cause the second SCR 44 to turn OFF both itself and the horn 50. For a more detailed description of the smoke detection apparatus just described, attention is directed to co-pending patent application Ser. No. 630,202 (Docket 6D-4637), filed herewith in the name of Robert J. Salem for HIGH GAIN SENSING AND SWITCHING MEANS FOR SMOKE DETECTORS and assigned to the assignee of this invention.

The smoke detection and warning apparatus just described requires for reliable operation that a battery connected to the terminals 16 and 18 have a sufficient energy reserve at all times to support both the sensing and the warning function of the smoke detector 10. If the battery is permitted to become depleted of energy, the result in the event of fire would be a failure of the smoke detector 10 to sound the horn 50 and thereby providing a warning. It is therefore important that means be provided for monitoring the battery energy level and producing appropriate warning signals when the battery energy drops to a predetermined level. It is also desirable that the battery energy detection and warning system provide not only transient warnings, but also a permanent warning. These objects are provided by the detection and warning system of this invention, which will now be described.

As previously indicated, batteries are commercially available which are characterized by a rapid and permanent drop in the battery output voltage after a predetermined portion of the initial battery energy has been depleted. One such battery is Mallory Model No. 304116 having an initial voltage of 12.3 volts. Upon depletion of approximately 60 percent of its total energy, its output voltage drops to approximately 10.6 volts. This latter voltage is then substantially maintained until the battery is completely drained of energy. By designing the smoke detection and warning portions of the smoke detector 10 to operate satisfactorily throughout a voltage range of 12.3 to 10.9 volts, the permanent voltage drop of the battery can be used to initiate low battery energy warning signals while the smoke sensing and warning functions are still fully operative.

Referring now to FIG. 1, the low battery energy detection and warning system includes a zener diode 70 and a pair of resistors 72 and 74 connected in series across the terminals 16 and 18. The zener diode 70 maintains a predetermined voltage drop at all battery voltages such that the resistors 72 and 74 experience the full voltage drop when the battery connected to the terminals 16 and 18 drops in voltage. For example, if the voltage across the terminals drops from 12.3 to 10.5 volts and the zener diode maintains a drop of 10 volts, the voltage across the resistors 72 and 74 will drop from 2.3 to 0.5 volts. In other words, a voltage drop of 15 percent at the terminals 16 and 18 causes a voltage drop of 78 percent across the resistors 72 and 74. A junction 76 between the resistors 72 and 74 is connected to the base of an NPN transistor 78 having its emitter connected to the terminal 18 and its collector connected to a junction 80. A capacitor 82 is connected between the junction 80 and the terminal 18, and a resistor 84 is connected between the junction 80 and the terminal 16. The juncion 80 is also connected to the anode of a programmable unijunction transistor (PUT) 86, which has its cathode connected through a resistor 88 to the gate of the SCR 44. The cathode of the PUT 86 is also connected to the gate of an SCR 90, which is connected in series with a coil 92 and a pair of normally closed contacts 94. A movable display element 96 illustrated schematically in FIG. 1 is coupled to the contacts 94 such that the contacts 94 are closed when the display element 96 is in a first position and such that the contacts are open when the display element is in a second position. As illustrated by the line 98, the position of the display element 96 is controlled in a manner hereinafter described by the coil 92. The gate of the PUT 86 is connected to a junction 100 between two resistors 102 and 104 connected across the terminals 16 and 18.

With reference to FIGS. 1 and 2, one form of the coil and display element assembly of FIG. 1 is illustrated by FIG. 2. As shown by FIG. 2, a display element or flag 96' is pivotally mounted about a shaft 110 for movement between a first position illustrated by broken lines and a second position illustrated by solid lines. A spring 112 is coiled around the shaft 110 and is captured between a first surface 114 on the smoke detector housing and a bearing surface 116 on the display element 96' such that the spring biases the display element or flag 96' toward the second solid line position. The flag 96' carries a conductive strip 118 which closes the contacts 94 only when it is in its first position. The coil 92 is part of an electromechanical relay including a moveable latching element 120 having a first position illustrated by broken lines and a second position illustrated by solid lines, a spring 122 biasing the latching element toward the first position. When both the flag 96' and the latching element 120 are in their first broken line positions, a tab 124 on the flag 96' is engaged by a tab 125 on the latching element 120 to prevent the spring 112 from moving the flag 96' to its second position. The outer wall 130 of the smoke detector casing preferably has a slot 132 therein through which the display element 96' can project when in its second position to provide a warning that the battery energy is low. The flag 96' might, for example, carry an appropriate warning such as "REPLACE BATTERY NOW" to warn the owner that the battery energy is low. When the flag is in its first broken line position, however, the flag cannot be seen by the user. It will thus be seen that the first position is a non-warning position and that the second position is a warning position.

The operation of the battery energy detection and warning means will now be described with reference to FIGS. 1 and 2. The zener diode 70 and the resistors 72 and 74 are selected such that the voltage at junction 76 is sufficient to turn on the transistor 78 when the battery voltage is above a predetermined level and such that the voltage at junction is insufficient to maintain the transistor 78 conductive when the battery voltage drops below the predetermined level. For example, if the battery voltage drops from 12.5 to 10.5 volts when a certain amount of its energy is depleted, the elements may be selected such that the transistor 78 starts to turn OFF at 11.5 volts and is fully OFF when the voltage drops to 10.8 volts. This means that the transistor 78 is normally conductive, permitting current flow between the junctions 16 and 18 through the resistor and preventing the build-up of a charge on the capacitor 82. When, however, the battery voltage drops below the predetermined level, the transistor 78 starts to turn OFF, and a charge will build up over a period of time on the capacitor 82. The voltage at junction 80 will eventually rise to a level sufficient to turn ON the PUT 86, which will rapidly discharge the capacitor 82 through the resistors 88 and 89. The voltage at junction 80 will thus drop rapidly, and the PUT 86 will turn OFF. Since the terminal voltage is still below the predetermined level and the transistor 78 is at least partially OFF, the capacitor 82 will start charging again through the resistor 84. As a result, the PUT 86 will turn ON again as soon as the voltage at the junction 80 reaches the necessary trigger point for the PUT 86. In this manner, it may be said that output signals are periodically produced at the cathode of the PUT 86 whenever the voltage at the junction 16 and 18 fall below the predetermined level for a period of time. If for some reason the battery voltage should drop for a brief period of time, an output signal would not be produced at the cathode of the PUT 86 since the capacitor 82 would not have sufficient time to charge before the transistor 78 is turned ON again to discharge the capacitor.

To simplify the description somewhat, it may be said that the signal generating means just described includes first circuit means 150 comprising the capacitor 82, second circuit means 152 connected to the terminals 16 and 18 and the first circuit means 150 for gradually charging the capacitor when the terminal voltage drops below a predetermined level for a period of time, and third circuit means 154 connected to the first circuit means for rapidly discharging the capacitor when the charge on the capacitor exceeds a predetermined level. It will, of course, occur to those skilled in the art that the second and third circuit means can take on forms differing from that specifically described herein while still providing the desired function of gradually charging and rapidly discharging a capacitor in the event of a low battery energy condition.

When the voltage at the terminals 16 and 18 initially falls below the predetermined level and the first output signal is produced at the cathode of the PUT 86, the voltage pulse produced is sufficient to turn ON the SCR 90 and thus energize the coil 92. As illustrated by FIG. 2, energization of the coil 92 causes the latching element 120 to retract to its solid line position against the biasing force of the spring 122, releasing the display element 96'. The spring 112 will then force the display element or flag 96' to its second or warning position in which it and possibly a warning legend thereon are exposed outside of the smoke detector casing. As the flag 96' moves to its warning position, the conducting strip 118 is withdrawn from the contacts 94 such that the contacts 94 are open and the coil 92 is thereby de-energized. The SCR 90 cannot thereafter be turned ON with the flag 96' in its warning position and the contacts 94 open. This means that the coil 92 is energized only in response to the first output signal produced at the cathode of the PUT 86.

The first output signal produced at the cathode of the PUT 86 is also supplied to the gate of the SCR 44 to turn ON the horn 50, which will sound so long as the SCR 44 remains ON. This initial sounding of the horn 50 may not be very loud or very long for two reasons, the first being that the coil 92 is simultaneously drawing substantial current from the battery connected to terminals 16 and 18 and the second being that the energy being discharged by the capacitor 82 is being supplied to both SCR's 90 and 44. Since, however, the display element 96' is permanently displayed in response to the first output signals, there is no need to thereafter turn ON the SCR 90 and energize the coil 92. This is accomplished by the mechanical opening of the contacts 94 as the flag 96' moves from its first non-warning position to its second warning position. As a result, the total energy of each subsequent output signal is delivered to only the SCR 44, the SCR 44 thereby being turned ON for a longer period and the horn 50 being the only significant load on the battery. This means that the horn signal will normally remain on longer and be louder than it would be if the coil 92 were energized each time an output signal is produced. In addition, the battery will last longer and support warning blasts of the horn 50 for a longer period of time since energy is not expended in uselessly energizing the coil 92 in response to each and every output signal.

From the foregoing, it will be appreciated that the display element 96 is permanently displayed in response to the first output signal caused by a rapid discharge of the capacitor 82. Thereafter transient warning blasts of the horn 50 are produced in response to each subsequent output signal. Unless the battery is promptly replaced, these transient signals will continue until the battery energy is completely exhausted. Since the occupants of the premises in which the smoke detector 10 is located may be absent for extended periods, it is desirable that the warning signals continue for a week or longer before completely discharging the battery. To accomplish this, the capacitor 82 and its charging resistor 84 and the associated elements are selected such that the charging cycle will take approximately 30 to 60 seconds when the transistor 78 is turned fully OFF. When the capacitor 82 is discharged, the output signals (other than the initial signal) are sufficient to hold the SCR 44 and the horn 50 on for approximately $50 \times 10^{-3}$ (50 milliseconds) seconds. In the event that the occupants of the premises containing the smoke detector 10 are absent for a period longer than the week or more period that it takes to run down the battery, the flag or display element 96 provides a permanent and visual warning that the battery should be replaced. If it were not for the flag, the occupants would not be warned that the smoke detector was inoperative because of an exhausted battery.

By way of example, a smoke detector having the circuitry of FIG. 1 has been built and successfully operated. As described in the aforesaid patent application Ser. No. 630,202, the detector included a measuring chamber 12 having a 1 microcurie source of Americium 241 and a reference chamber 14 having a 2 microcurie source of Americium 241. The chambers were adjusted to provide a saturation current of 35 picoamperes ($35 \times 10^{-12}$ amperes) and a voltage of approximately 3.3 volts across the measuring chamber 12 in the absence of smoke when the aforesaid Mallory battery was connected to the terminals 16 and 18. The chambers 12 and 14 were further adjusted to provide a voltage of 4.3 volts to the gate of the MOSFET 34 when the smoke level in the chamber 12 reaches 2 percent smoke. The MOSFET 34 was a 3 N 163, and the resistors 36 and 38 had resistance values of 27,000 and 15,000 ohms, respectively. The SCR 40 was a C 103 B and the SCR 44 was a C 103 B. The resistances of the resistors 46 and 52 were 1,000 and 6,800 ohms, respectively. The horn 50 included a commercially available horn Model 16003196, available from Delta Electric of Marion, Ind., in parallel with a 0.02 microfarad capacitor 60 and a 200 ohm resistor 58. The capacitor 62 had a capacitance of 330 microfarads. The zener diode 70 was a 10 volt ± 2 percent, and the resistors 72 and 74 have resistance values of 82,000 and 43,000 ohms, respectively. The transistor 78 was a 2N5172, and the capacitor 82 had a capacitance of 2.2 microfarads. The resistors 84, 88, 89, 102 and 104 had resistance values of $3.9 \times 10^6$; 3,300; 1,000; 300,000; and 200,000 ohms, respectively. The PUT 86 was a 2N6027 and the SCR 90 was a C 103 B.

From the foregoing, it will be seen that this invention provides improved means for periodically and permanently warning of a low battery energy condition in a battery-operated device such as a smoke detector. The invention provides reliable means for warning of a low battery energy condition without being responsive to brief transients in the battery voltage or other system charactersitics.

While the invention has been particularly shown and described with reference to a preferred embodiment thereof, it will be understood by those skilled in the art that various changes in form, details, and application may be made therein without departing from the spirit and scope of the invention. For example, as pointed out previously, the second and third circuit means 152 and 154 can take on forms differing from that specifically described. In addition, although the invention has been described for use in a smoke detector, it will occur to those skilled in the art that the invention is equally applicable to other battery-operated devices in which it is desirable that permanent and transient warning signals be produced in the event of a low battery energy condition. Accordingly, it is intended that all such modifications and changes be included within the scope of the appended claims.

What is claimed as new and is desired to secure by Letters Patent of the United States is:

1. For use in a battery-operated device such as a smoke detector, means for detecting when the battery voltage drops below a predetermined level and for providing warning in response thereto, said detection and warning means comprising:

terminal means for connection to the terminals of a battery, a capacitor, capacitor charging circuit means connected to said terminal means and said capacitor for gradually charging said capacitor when the voltage of a battery connected to said terminal means drops below a predetermined level, said capacitor charging circuit means including resistive means coupled to said capacitor, a normally conductive switching element in parallel with said capacitor, and voltage sensing means connected across said terminal means, said voltage sensing means coupled to said normally conductive switching element to maintain said normally conductive switching element conductive when the voltage of a battery connected to said terminal means is above the predetermined level and to render said normally conductive element non-conductive when the voltage of a battery connected to said terminal means drops below the predetermined level, whereby said capacitor charges only when the voltage of a battery connected to said terminal means drops below the predetermined level for a period of time, capacitor discharging circuit means connected to said capacitor and responsive to the voltage of said capacitor for rapidly discharging said capacitor when the charge on said capacitor exceeds a predetermined level, and alarm means coupled to said capacitor discharging circuit means for producing a warning signal in response to at least the initial discharge of said capacitor.

2. Battery voltage detection and warning means as defined by claim 1 in which said normally conductive switching element is a transistor, said second switching means further comprising a zener diode and a voltage divider connected in series across said terminal means, the base of said transistor being connected to said voltage divider at a point at which the voltage is sufficient to maintain said transistor conductive when the voltage of a battery connected to said terminal means is above the predetermined level and is insufficient to maintain said transistor conductive when the voltage of a battery connected to said terminal means drops below the predetermined level.

3. Battery voltage detection and warning means as defined by claim 2 in which said capacitor discharging circuit means includes a normally non-conductive switching means.

4. Battery voltage detection and warning means as defined by claim 3 in which said normally non-conductive switching element is a PUT having its anode connected to said capacitor, its gate connected to a source of relatively fixed voltage substantially exceeding the discharged voltage of said capacitor, and its cathode connected to said alarm means, said PUT conducting only when the voltage on said capacitor substantially exceeds the voltage of the source of relatively fixed voltage such that said PUT conducts only when the voltage of a battery connected to said terminal means drops below the predetermined level for a period of time.

5. Battery voltage detection and warning means as defined by claim 4 in which said alarm means further comprises first alarm means coupled to said PUT for producing a permanent warning signal in response to the first discharge of said capacitor through said PUT and second alarm means coupled to said PUT for producing a transient warning signal in response to each discharge of said capacitor through said PUT.

* * * * *